United States Patent [19]

Feissel

[11] 4,423,509
[45] Dec. 27, 1983

[54] METHOD OF TESTING A LOGIC SYSTEM AND A LOGIC SYSTEM FOR PUTTING THE METHOD INTO PRACTICE

[75] Inventor: M. Henri Feissel, Paris, France

[73] Assignee: Compagnie Internationale pour l'Informatique Cii Honeywell Bull (Societe Anonyme), Paris, France

[21] Appl. No.: 267,347

[22] Filed: May 26, 1981

Related U.S. Application Data

[63] Continuation of Ser. No. 61,006, Jul. 26, 1979, abandoned.

[30] Foreign Application Priority Data

Jul. 27, 1978 [FR] France .............................. 78 22228

[51] Int. Cl.³ ............................................ G06F 11/22
[52] U.S. Cl. ................................. 371/25; 324/73 AT
[58] Field of Search .............. 371/25, 15; 324/73 AT, 324/73 R

[56] References Cited

U.S. PATENT DOCUMENTS

| | | | |
|---|---|---|---|
| 3,761,695 | 9/1973 | Eichelberger | 371/25 |
| 3,784,907 | 1/1974 | Eichelberger | 324/73 AT X |
| 3,789,205 | 1/1974 | James | 324/73 R X |
| 3,790,885 | 2/1974 | James | 324/73 R |
| 3,924,144 | 12/1975 | Hadamard | 324/73 R X |
| 3,961,251 | 6/1976 | Hurley et al. | 324/73 AT |
| 3,961,252 | 6/1976 | Eichelberger | 324/73 AT |
| 3,961,254 | 6/1976 | Cavaliere et al. | 324/73 AT |
| 4,063,080 | 12/1977 | Eichelberger et al. | 324/73 AT X |
| 4,074,851 | 2/1978 | Eichelberger et al. | 371/25 |

OTHER PUBLICATIONS

Williams "Testing of LSI Logic Circuits Containing Imbedded Shift Arrays" *IBM Tech. Disclosure Bulletin*, vol. 20, No. 18, Mar. 1978 pp. 4021-4022.

Sarkar "N-Way Testpoint for Complex LSI Design" *IBM Tech. Disclosure Bulletin*, vol. 14, No. 10 Mar., 1972, pp. 2937-2938.

*RCA 1974 COS/MOS Digital Integrated Circuit Databook* No. SSD-203 B pp. 100-102.

Primary Examiner—David H. Malzahn
Attorney, Agent, or Firm—Kerkam, Stowell, Kondracki & Clarke

[57] ABSTRACT

A method for testing a logic system of the type having points not directly accessible from the exterior, and logic systems including means for carrying out the method. A particular logic state may for test purposes be applied (set) at a particular, normally-inaccessible point in the system; or the logic state at a particular, normally-inaccessible point in the system may be sampled. To accomplish these functions, there are a plurality of flip-flops and associated selective gating circuitry, for example AND-OR select gates, arranged selectively either to connect the flip-flops in series to form a shift register configuration whereby data defining particular logic states to be set, or particular logic states which have been sampled, may be clocked in or clocked out by accessing only the input of the first flip-flop or the output of the last flip-flop; or to connect the inputs and outputs of the various flip-flops to particular points in the system for the purposes of setting and sampling logic states. The logic system may, for example, be either a single integrated circuit chip, or a circuit module having a limited number of external connections.

22 Claims, 8 Drawing Figures

METHOD OF TESTING A LOGIC SYSTEM AND A LOGIC SYSTEM FOR PUTTING THE METHOD INTO PRACTICE

This application is a continuation, of application Ser. No. 061,006, filed July 26, 1979 now abandoned.

BACKGROUND OF THE INVENTION

The present invention relates to methods of testing logic systems, and logic systems in which the methods are applied.

The system according to the invention is advantageous in that it allows a logic state or states to be modified or detected in a signal-processing system whose interconnecting circuits are not directly accessible from the exterior.

The invention is applicable in particular to the checking and use of large-scale integrated circuits, normally referred to as LSI circuits, and to equipment which makes use of LSI circuits.

So-called large-scale integrated circuits owe their name to the fact that they comprise a very large number of individual circuits which are deposited on one chip by integrated circuit techniques.

The use of such circuits has grown very rapidly in all fields of elecronics. Among their many important advantages are the following:

(1) High performance;
(2) Good reliability;
(3) Small size; and
(4) Moderate manufacturing cost.

However, these advantages are counterbalanced by disadvantages which make it necessary for manufacturers to take precautions both in using them and in designing them.

It is therefore necessary to find methods and means for allowing effective tests to be performed on LSI integrated circuits and on equipment using them.

These tests need to recognize all the faults which are present even though, as one moves further away from individual components, it becomes increasingly difficult, if not impossible, to detect and locate faults.

It will be apparent from the above that the methods and means of testing are of prime importance in making sensible use of LSI circuits.

There is also another aspect of modern data processing circuits which needs to be mentioned with regard to testing operations.

The miniaturization made possible by modern technology has enabled manufacturers to produce more complex circuits without any excessive increase in the size and cost of the equipment. Taking advantage of this, one of the first applications which was thought of is the production of fault-proof systems. Accordingly, there are self-repairing systems of various kinds in existence.

One known type of equipment makes use of circuit redundancy. In the event of one or more circuits failing, additional circuits take the place of the faulty circuits. One example is so-called "majority logic" equipment.

Another type of equipment makes use of redundancy in the signals processed. The signals include additional states which enable checking and repair circuits to correct the consequences of faulty operation by certain circuits.

With both of these equipment types, a number of circuits may be faulty without any external sign of faulty operation being apparent. The equipment conceals its faults.

In operations involving the testing of equipment which includes known self-correcting arrangements to detect faults, it is essential to have means capable of detecting all the faults, including those which have been dealt with by self-correction.

An already stated, LSI circuits are in fact carried on a chip of small dimensions. Given this fact, in order not to lose the benefit of miniaturization and in order not to detract from reliability, LSI circuits have only a small number of external connections. At the present time the number of connections, also termed terminals, is of the order of fifty.

If it is considered that one chip may contain several hundred circuits, it is clear that from the terminals it is generally possible only to reach the circuits positioned at the two electrical extremities of the chip, that is to say at its input and output. Generally, under no circumstances is it possible to gain access to the circuits or interconnections situated at the heart of the chip, given their extreme density.

This disadvantage also extends to modules which employ groups of chips since these modules, for the same reasons as above, have only a limited number of access terminals. In summary, it can be said that if no special provisions are made, it is not possible to gain access from the exterior to intermediate circuits situated at the heart of chips or modules. This is a serious disadvantage when equipment of this type is to be tested to detect any breakdowns or faults which it may have.

The need for testing arises both during the manufacture of LSI circuits and during their subsequent use. To ensure the quality of his products, a manufacturer has to check the satisfactory operation of all the circuits. This is the price he has to pay to be sure of obtaining a faultless product.

Various publications have been devoted to testing, diagnosis and maintenance techniques. Reference may be made to the following books: "Fault Diagnosis of Digital Systems" authored by Chang, Manning and Metze, and published by Wiley in 1970; and "Fault Detection in Digital Circuits" authored by Friedman and Menon, and published by Prentice Hall in 1971.

More recent developments in techniques for detecting and locating faults are reviewed in the journal "Computer" for June 1976 in an article authored by Bennets and Scott entitled "Recent Developments in the Theory and Practice of Testable Logic Design."

As has just been seen, in the case of complex circuits having interconnecting networks which are inaccessible from the exterior, as they are in the case of self-repairing circuits, prior art techniques do not allow all the faults which may occur in such circuits to be detected and located.

SUMMARY OF THE INVENTION

The present invention provides a solution to this problem through the provision of a logic system which provides means for the certain detection and location of faults existing in integrated circuits having complex interconnecting networks.

To this end, the invention has as an object a method of testing a logic system of a given configuration whose interconnecting network is inaccessible from the exterior and in which it is desired to detect breakdowns, faults or the like. The method is generally of the type in which operation of type system in its normal configuration is checked by means of various processes, for example, sensitizing logic paths and changing initial test states. More particularly, after the check described above, action is taken on at least one of the interconnections between the circuits belonging to the system in order to render one or more paths which had escaped the previous checking operation sensitive to tests, and a testing configuration and/or sequence which is capable of showing up the above-mentioned faults on the sensitized path or paths is then applied to at least one of the circuits, and the system is returned to its normal state by re-establishing the original interconnections between the circuits.

In accordance with another feature of the invention, the action taken on the interconnection is such as to alter at least one logic path between at least two circuits.

It may also be mentioned that, in accordance with the invention, the above-mentioned alteration to the logic path is brought about by means of at least one of the circuits belonging to the system.

In another embodiment, the above-mentioned alteration or modification to the logic path is performed by incorporating at least one testing circuit in at least one of the circuits belonging to the system.

In accordance with another feature of the method of the invention, the above-mentioned modification comprises setting a logic state at at least one point in the system.

The invention also relates to a logic system having a network inaccessible from the exterior for putting into practice a method having the above-mentioned features. The logic system is generally of the type comprising, in essence, various logic circuits connected by a network of interconnections inaccessible from the exterior and of no specific configuration. More particularly, the logic system includes at least one action-taking circuit which forms part of the system and which is capable of being operated in such a way as to define the logic state at at least one point in the system.

The system is characterized in that the action-taking circuit includes at least one device, for example a flip-flop, for setting the logic level at at least one point in the system.

In accordance with another feature of the invention, the action-taking circuit includes at least one device, for example a flip-flop, for sampling the logic level at at least one selected point in the system.

In accordance with another feature of the invention the setting and sampling devices comprise one and the same flip-flop.

This one flip-flop is connected to at least some of the other flip-flops in the system to allow shift register operation.

The above-mentioned one flip-flop is a functional flip-flop belonging to the system which is capable of operating in either a normal mode, a sampling mode, or a setting mode, as desired.

It will be appreciated that the invention is applicable to integrated circuit chips, modules or the like which are listed by way of example and not limitation, fitted with a logic system having the briefly above-described features.

BRIEF DESCRIPTION OF THE DRAWINGS

Other objects, features and advantages of the invention will be better apparent from the following description, given with reference to the accompanying drawings, in which.

DESCRIPTION OF THE PREFERRED EMBODIMENTS

Figure 1:
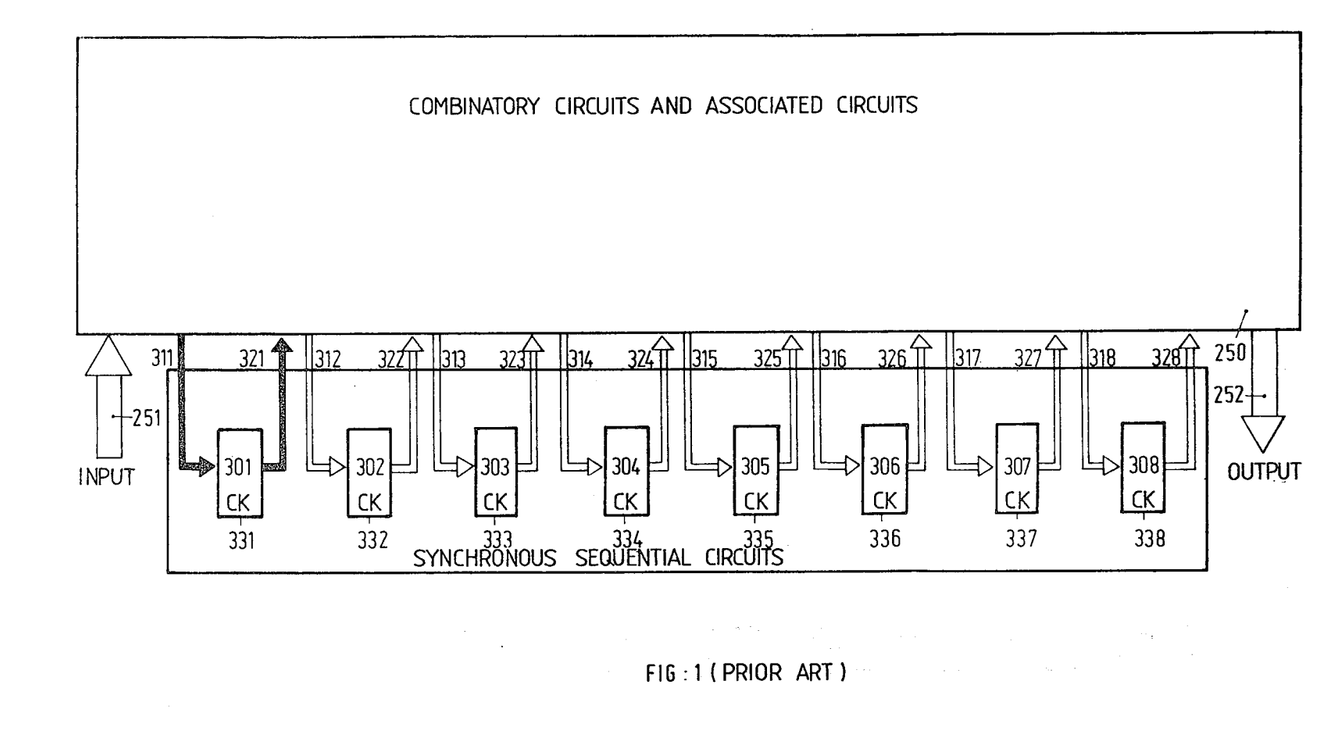
FIG. 1 is a diagram showing the flow of data through a prior art data processing logic system comprising series-parallel registers, in the normal operating mode.

FIG. 1 shows the flow of data in the normal mode of operation in a prior art data processing system involving registers which can be connected in two modes, either parallel or series.

To simplify the explanation, individual flip-flops have been shown. It will be appreciated, however, that these flip-flops could be replaced by a plurality of flip-flops to form a register without affecting the validity of what is stated herein.

Input signals 251 to the system are applied to a group 250 of combinatory circuits where they may possibly undergo combinatory processing before being converted to signals 311 which are applied to a plurality of flip-flops comprising a register 301. A clock (CK) signal 331 causes the signals 311 to be transferred to the appropriate flip-flops in register 301. After this transfer, the signal content is stored in register 301 and the states of the various flip-flops are transmitted in parallel in the form of signals 321 to the group 250 of combinatory circuits and similar circuits. The signals are there subjected to processing before being transmitted along path 312 to a plurality of flip-flops comprising a 302. The signals are fed into register 302 in response to a clock (CK) signal 332. The signals are then stored in the various stages of register 302 and transmitted in parallel along path 322 to the group 250 of combining and similar circuits.

In this way the data is processed and stored in stages until the final data is arrived at and emerges along path 252.

Figure 2:
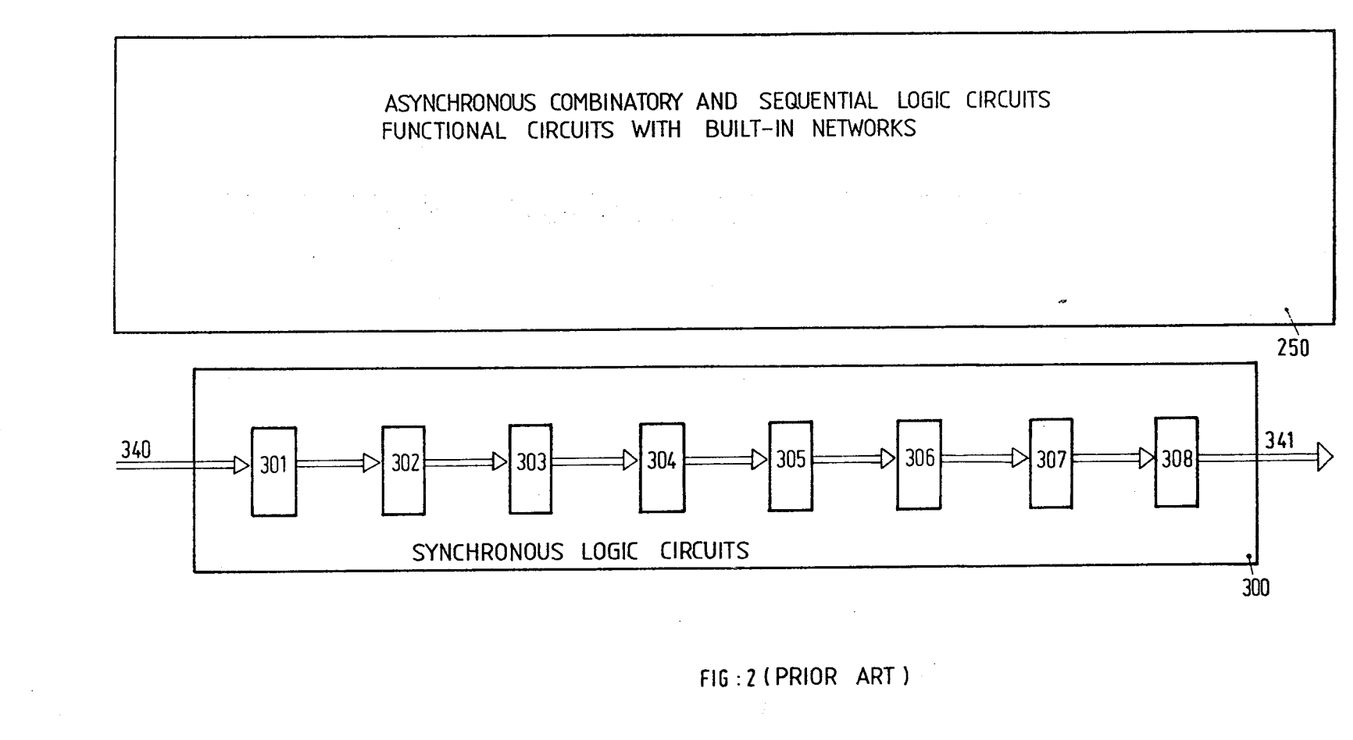
FIG. 2 is a diagram of data flow when the prior art system is in the testing mode and the registers are connected as a shift register.

FIG. 2 shows data flow when the system of FIG. 1 is set to the checking mode for trouble-shooting or maintenance.

In this case, the operator wishes:

(1) To find the logic states of the various flip-flops in the system in order to be able to compare them with the normal states. From this comparison he will make a diagnosis of the standard of operation of the system; and (2) To set the flip-flops in the various registers to specific states so that the system can be set to a specific initial state.

To perform these operations, the clock (CK) signals 331, 332, 333, 334, 335, 336, 337 and 338 are suspended or shut off.

The flip-flops are set to the checking mode. This means that they are connected in series to form a shift register.

It will be appreciated that the flip-flops may be connected in such a way as to form a plurality of shift registers. This arrangement has the advantage of producing shorter shift registers and at the same time reduces the number of shifts necessary to reach a given state. This in no way alters the concepts of the invention described herein.

Initially, the state of the last flip-flop 308 is given by path 341.

To find the state of the next previous flip-flop 307, it is merely necessary to apply a read-out shift pulse which transfers the contents of all the flip-flops to the right, i.e., the content of flip-flop 307 to flip-flop 308, that of 306 to 307, that of 305 to 306, and so on, down to that of 301 to 302.

Thus, at the first shift, path 341 gives the state which was present in 307 at the time of the changeover to the testing mode, at the second shift, that which was present in 306, and so on.

Thus, in stages, the contents of all the flip-flops are fed out in succession along path 341.

Conversely, if at the time of the first shift operation the content which it is desired to find in flip-flop 308 at the end of the complete shift operation has been applied to data path 340, this content will be recorded in flip-flop 301. During the transfer operations, this content will move along step-by-step until it is situated at 308. It will be seen that at this moment flip-flop 308 will contain the state from flip-flop 301. It will merely be necessary to make one additional shift to bring the system to its original state once the content has arrived at flip-flop 308.

In the same way, before the second shift operation it is merely necessary to apply to data path 340 the content which it is desired to obtain in flip-flop 307, in order to allow it to be fed into flip-flop 301. In the course of the various read-out shifts, this content will move to the right until, at the end of read-out, it reaches flip-flop 306. In this case too, all that is necessary is an additional pulse to transfer this content to flip-flop 307, which will thus be initialized.

It can thus be seen that it is possible to change all the flip-flops, in stages, to set them to a predetermined initial state. The read shift operation is accompanied by a write shift operation.

This arrangement is very useful for testing purposes since it enables closely defined configurations to be applied to points which are inaccessible from the exterior. By making use of the possibility of having the synchronizing clock (CK) signals 331, 332, 333, 334, 335, 336, 337 and 338 operate in a step-by-step mode it is possible in the next phase to log the result obtained.

Figure 3:
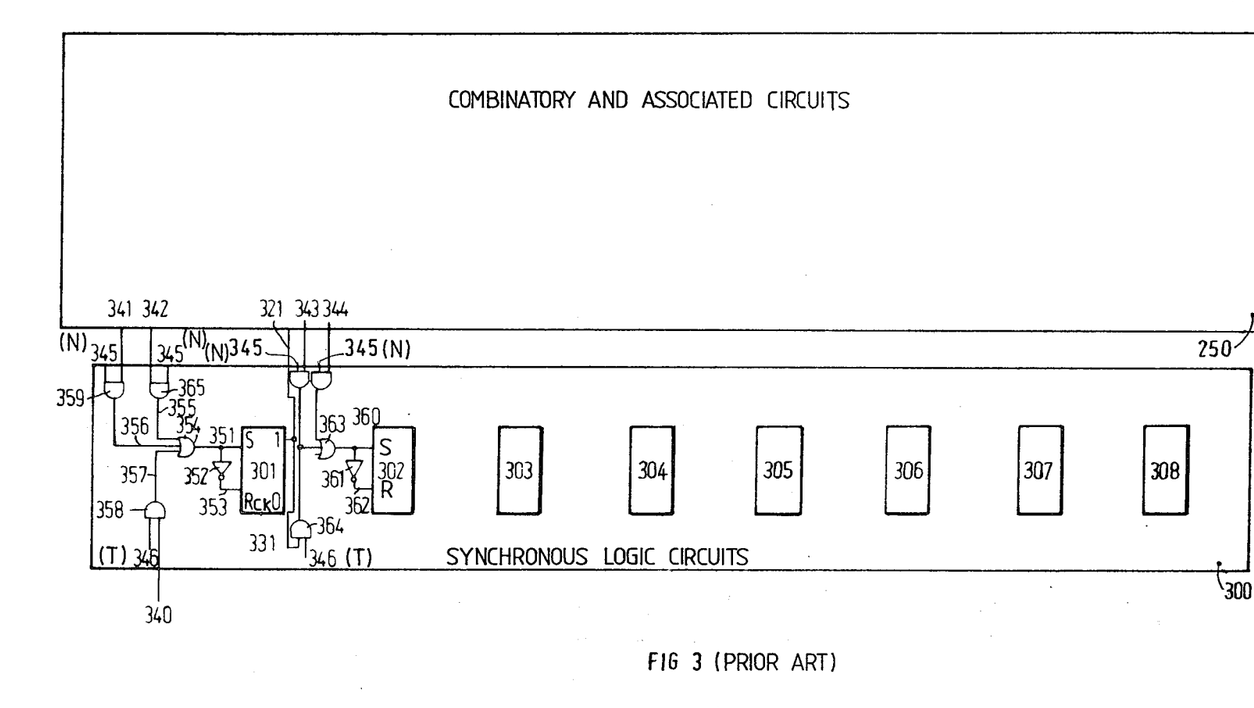
FIG. 3 shows one of the possible prior art electrical connecting schemes for a flip-flop in a system of this kind.

FIG. 3 is a circuit diagram for a flip-flop operating in the modes illustrated in FIGS. 1 and 2. It will be appreciated that the circuitry connected to the representative flip-flops 301 and 302 comprises a form of selective gating circuit, specifically AND-OR SELECT gating circuitry, at the input and output of each flip-flop to selectively connect the inputs and outputs of the flip-flops to different points in the circuit for different functional modes.

In the normal operating mode, a normal (N) mode control signal 345 is high and a test (T) control signal 346 is low.

If the operation of flip-flop 301 is considered, it will be seen that the signal 341 coming from the group 250 of combinatory and similar circuits passes through AND gate 359, which has been enabled by the normal (N) mode control signal 345. The signal then passes through OR gate 354 and goes directly to the set (S) input 351 of flip-flop 301; and via an inverter 352 to the zero reset (R) input 353 of the flip-flop 301.

At the moment when the clock (CK) signal 331 arrives, the signal from the OR gate 354 is transferred to the flip-flop 301.

In the same way, signal 342 passes through AND gate 365 and is applied to the inputs of flip-flop 301.

On the other hand, input signal 340, which is the "series" input signal, encounters AND gate 358 which is not enabled because the test (T) signal 346 is low.

The output signal 321 from the flip-flop 301 is supplied to the group 250 of combinatory and similar circuits; and to an AND gate 364, which is not enabled because the test (T) signal 346 is low.

During operation in the testing mode, the normal (N) mode control signal 345 is low and the test (T) mode control signal 346 is high.

Under these conditions gate 359 and 365 are not enabled, and the set (S) input 351 and the reset (R) input 353 of the flip-flop 301 are cut off from the group 250 of combinatory and associated circuits.

The "series" input signal 340 on the other hand is able to gain access to the inputs of flip-flop 301 via AND gate 358, which is enabled by test (T) signal 346, and via OR gate 354.

The output signal 321 from flip-fop 301 is supplied to the combinatory logic 250; and to AND gate 364, which is enabled by test (T) control signal 346. The flip-flop 301 output signal 321 continues on its way through OR gate 363 and is applied to the inputs of flip-flop 302, directly to the set (S) input 360 and via an inverter 361 to the reset (R) input 362.

Thus, if the logical process is pursued, it will be seen that when the test (T) control signal 346 is high, the flip-flops 301-308 are effectively connected in series, forming a shift register configuration. The output of one flip-flop is applied to the input of the next.

For there to be a transfer of the contents of one flip-flop to the next flip-flop, it is merely necessary for the clock (CK) pulses 331, 332, 333, 334, 335, 336, 337 and 338 to occur simultaneously. It is only in the case of flip-flop 308 that transfer takes place along path 341 to an external handling circuit.

In the same way, by performing shift operations, it is possible to change the flip-flops to a particular configuration from the "series" input.

From the foregoing description of the prior art, it will be seen that there was no possibility of reaching the connecting network inside the integrated circuits represented by the group 250 of combinatory and associated circuits. In particular there was no means of, for example, cutting out the self-correcting circuits.

The present invention, however, provides a solution to such problems, as the following description will show.

Figure 4:
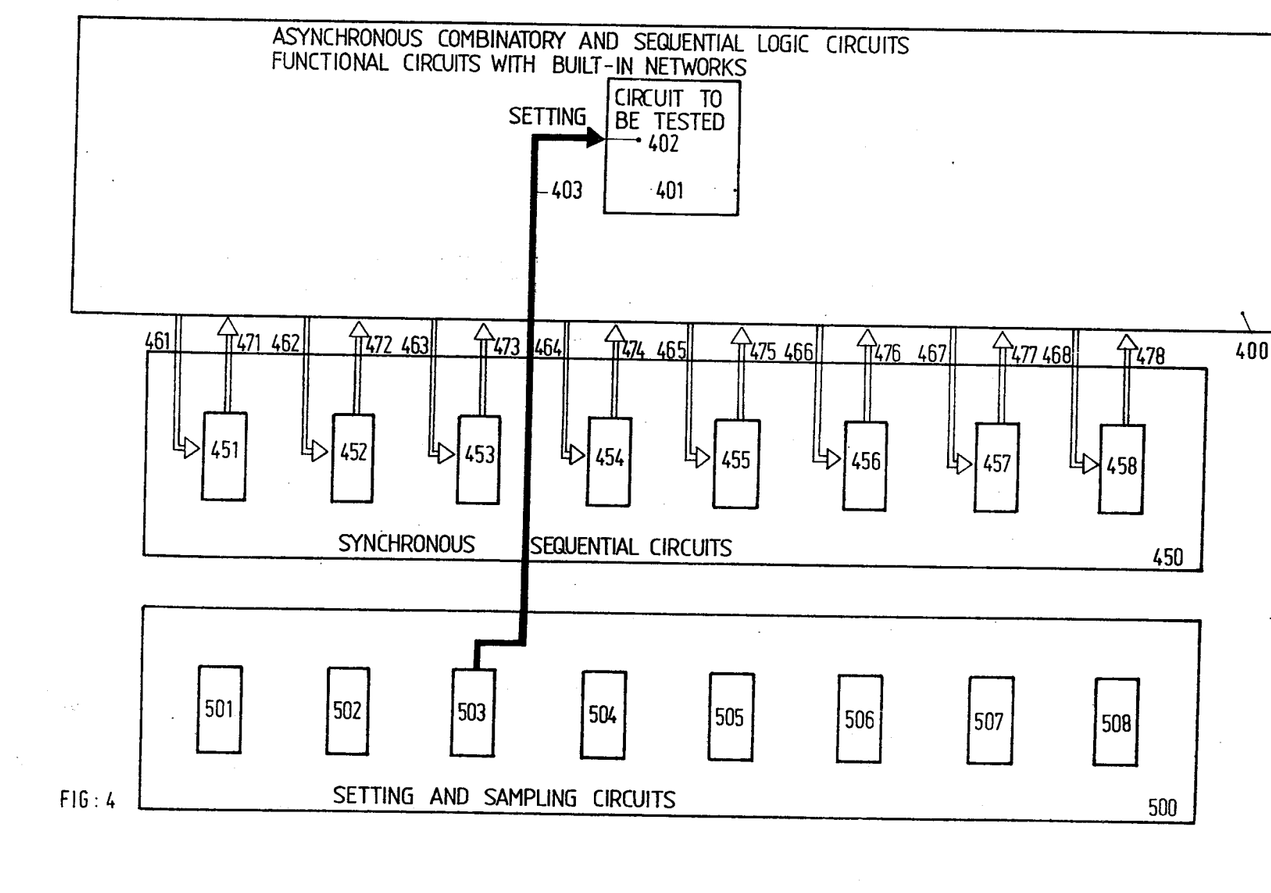
FIG. 4 is a diagram of data flow in a system acccording to a particular embodiment of the invention which comprises setting and sampling flip-flops and which is operating in the setting mode.

FIG. 4 is a block diagram of an arrangement according to the present invention. This diagram shows the flow of data during a testing operation, with an input signal being applied at a circuit 401 to be tested. The signal processing system shown is made up of a group 400 of combinatory and similar circuits, a group 450 of synchronous sequential circuits, and a group 500 of setting and sampling circuits.

It will be appreciated that FIG. 4 differs from FIG. 1 in that it includes the group 500 of setting and sampling circuits. The flip-flops or registers may operate in two modes: the series mode and the parallel mode.

The situation shown in FIG. 4 is that prevailing in the testing phase which follows the operation of initializing the flip-flops. In the initializing phase, the various flip-flops 501, 502, 503, 504, 505, 506, 507 and 508 of the system are set to configurations laid down by the test which is to follow. In particular, in the illustrated case, the setting flip-flop 503 has been set to a state corresponding to the setting envisaged by the test. The setting may be to the logic "0" level or the logic "1" level. In the testing phase which is shown, flip-flop 503 sets a signal at input 402 of the circuit or module 401 to be tested, via a connection 403. The set signal may, for example, inhibit a self-correcting circuit situated in the circuit or module 401. It can be seen that the setting may take place in a complex circuit without any direct access to the point to which the setting is applied. The setting is made possible by using setting circuits which have been loaded using shift register operation.

Figure 5:
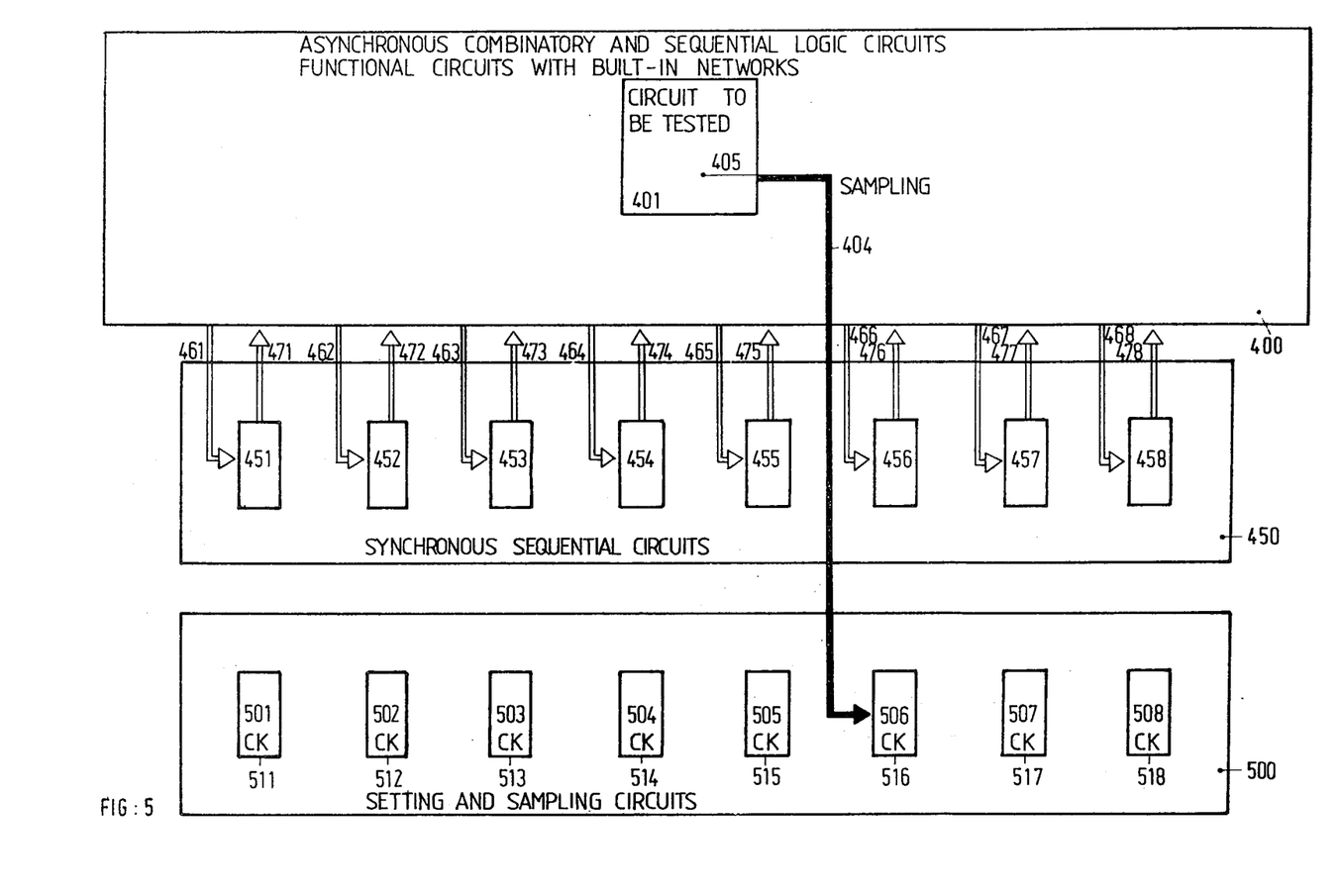
FIG. 5 is a diagram of data flow in the above system when in the operational mode, the setting and sampling circuits being in the sampling mode.

FIG. 5 relates to the operations of the signal processing system in the normal mode. In FIG. 5, the operation of the setting circuits during testing periods is shown. Outside the testing periods, the same arrangement is used for the purposes of sampling. In particular, it is useful to be able to learn the value of certain internal states in the circuits. As an example, it is desirable in the course of a maintenance operation to know whether a majority logic circuit has lost one of its decision channels. For this purpose the state of a circuit which reports dissent by at least one vote may be sampled. The sampling may be performed by one of the flip-flops used in the setting mode since in normal periods these flip-flops are not used. FIG. 5 is a block diagram of the flow of signals in the system in normal operation. Again present are the signals normally exchanged between the group 400 of combinatory and similar circuits and the group 450 of synchronous sequential circuits, these being signals 461, 462, 463, 464, 465, 466, 467 and 468, which are fed to the synchronous sequential circuits 450 from the combinatory circuits 400; and signals 471, 472, 473, 474, 475, 476, 477 and 478, which are fed to the combinatory circuits 400 from the sequential circuits 450.

Added to these signals are the signals for the sampling operations performed in the combinatory circuits 400. To simplify the drawings and the explanation, only a single sampling circuit has been shown, but it is understood that all of the flip-flops 501, 502, 503, 504, 505, 506, 507 and 508 contained in group 500 may be connected in the manner just described.

The point 405 at which the level is to be sampled is connected by a connection 404 to flip-flop 506. At the moment selected for the sampling, a clock (CK) pulse 516 causes the signal carried by the connection 404 to be transferred to the flip-flop 506. In this way the logic state at point 405 is stored in flip-flop 506.

Figure 6:
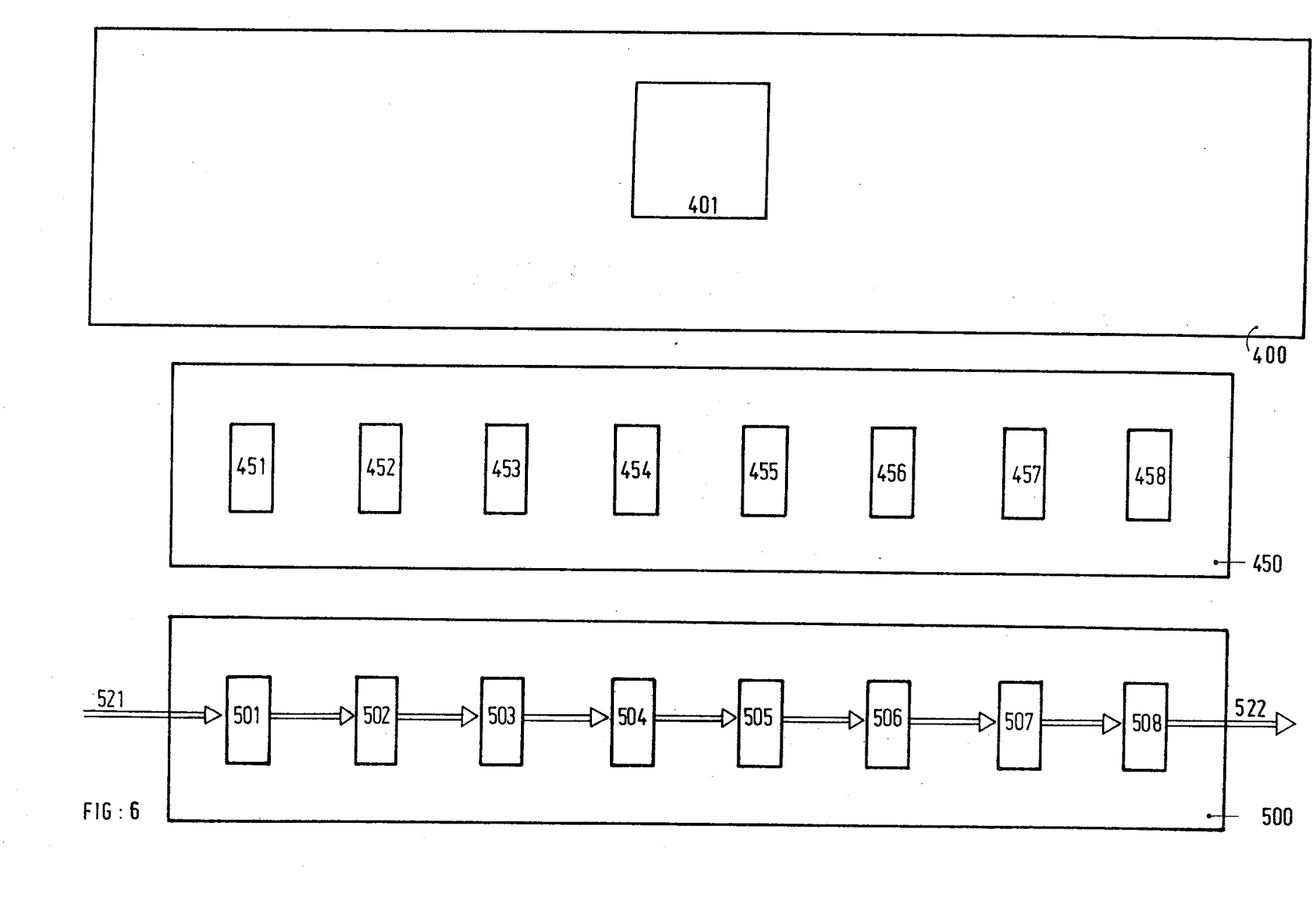
FIG. 6 is a diagram of data flow in the above system during the initialization phase.

FIG. 6 relates to the operation of emptying and loading the setting and sampling circuits.

This operation is performed by connecting the flip-flops in series and having them operate as a shift register.

To simplify the drawings and explanation, the group 500 of setting and sampling circuits is considered on its own. It will, however, be appreciated that the group 500 may be associated with the synchronous sequential circuits 450 to form a single shift register.

Similarly, the flip-flops 501, 502, 503, 504, 505, 506, 507 and 508 of the setting and sampling circuits may be differently connected in such a way as to form a plurality of shorter shift registers which can be operated separately.

In the present case also, the content of flip-flop 508 is available at the series output 522. If a clock or shift pulse is transmitted to all the flip-flops 501, 502, 503, 504, 505, 506, 507 and 508, the content of each flip-flop shifts to the flip-flop on its immediate right. The first clock pulse thus causes the content of the flip-flop 507 to appear at 508, the second clock pulse causes the original content of flip-flop 506 to appear at 508, and so on until the seventh clock pulse which causes the original content of flip-flop 501 to be fed out.

During the shift operations it is possible, by applying suitable signals to the series input 521, to feed a desired configuration into the flip-flops.

The first clock pulse feeds the signal on line 521 into flip-flop 501, the second clock pulse moves the content of 501 to 502 and the signal on line 521 to 501. Step by step, all the flip-flops are loaded.

Figure 7:
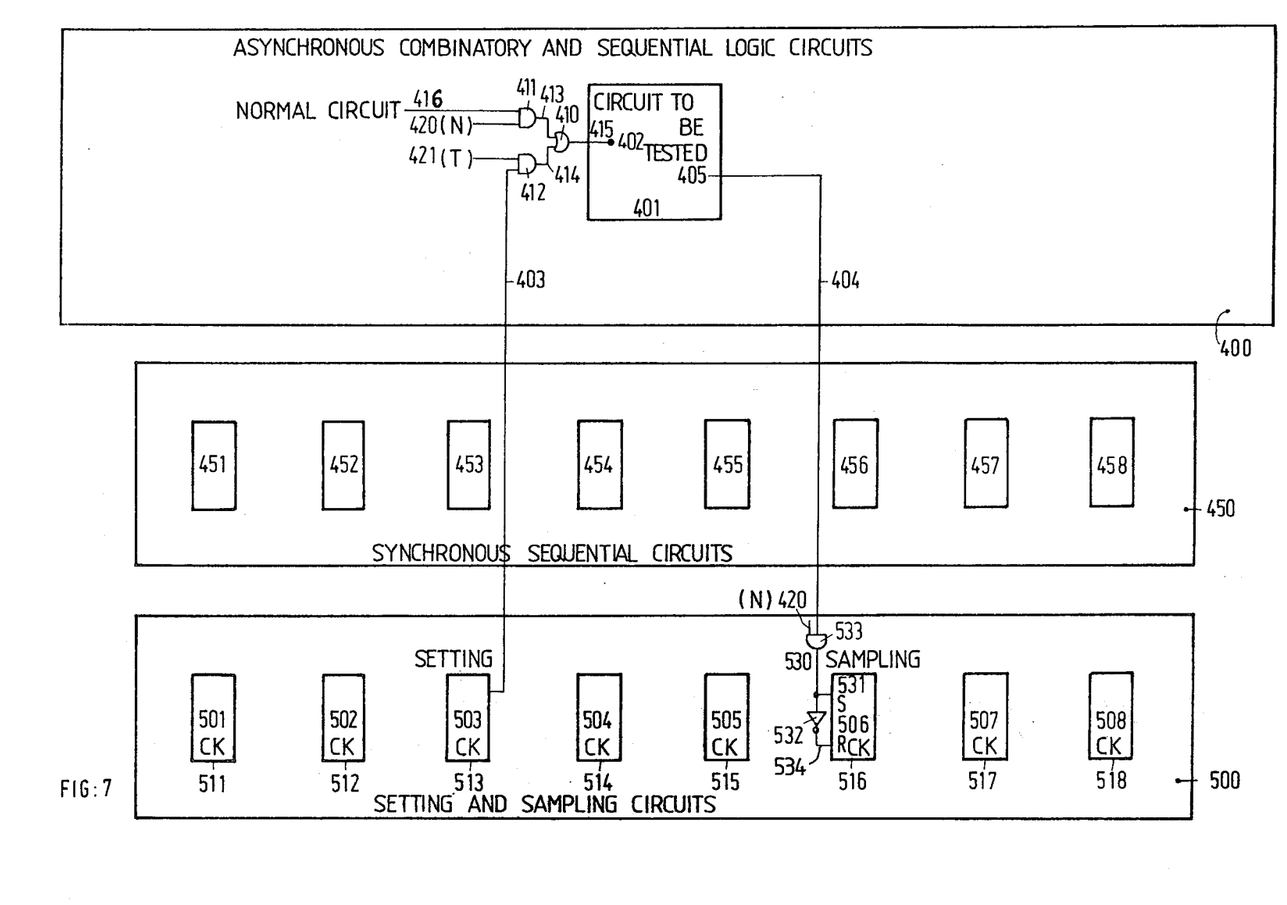
FIG. 7 shows one embodiment of the electrical connection circuitry for the setting and sampling of flip-flops.

FIG. 7 shows how a setting and sampling flip-flop is connected electrically in the arrangement whose operation has been described with reference to FIGS. 4, 5 and 6. The electrical connections of only one flip-flop have been shown for reasons of simplicity in the drawing and explanation, but the connections are identical for the other flip-flops. In the same way, the exposition may be expanded by considering the place of each flip-flop to be taken by a plurality of flip-flops.

In normal operation, the normal (N) mode control signal 420 is high and enables AND gates 411 and 533. The test (T) mode control signal 421 is low, and AND gate 412 is not enabled. Under these conditions, the circuit 401 to be tested operates normally. In particular its input 402 is supplied from connection 415 which, in turn, is supplied from input connection 416 via AND gate 411 and OR gate 410. The point 405 to be checked supplies line 404. This line 404 runs to AND gate 533, which is enabled by normal (N) mode control signal 420. The signal emerging at 530 is applied to flip-flop 506 at two points: directly to the set (S) input 531; and to the zero reset (R) input 534 via an inverter 532.

Under these conditions it will be appreciated that flip-flop 506 is set in accordance with the signals at its inputs as soon as it is actuated by clock (CK) signal 576.

At the time of operation in the testing mode, normal (N) mode control signal 420 is low and AND gates 411 and 533 are not enabled. Test (T) mode control signal 421 on the other hand is high, thus enabling AND gate 412.

The output of flip-flop 503, which has been loaded in the series mode, is applied via a line 403 to AND gate 412. The output signal 414 from the AND gate 412 is applied to the input of the circuit 401 to be tested via OR gate 410.

The input to the circuit 401 to be tested is thus at a logic level dictated by the content of flip-flop 503. The input is set to this level, and no longer depends on the state on input connection 416.

It is, of course, perfectly possible to use sampling flip-flops which are connected to specific points during the setting periods.

It should be noted that the present means may be used for quite different purposes. In particular, their use may simplify configurations and procedures in highly complex circuits. They may, for example, provide a shortcut to the paths for sensitizing the circuits to testing. They may also be used to do away with multiple paths or the path for activation for testing. They may also be used to open loops or again to exert control within circuits.

Figure 8:
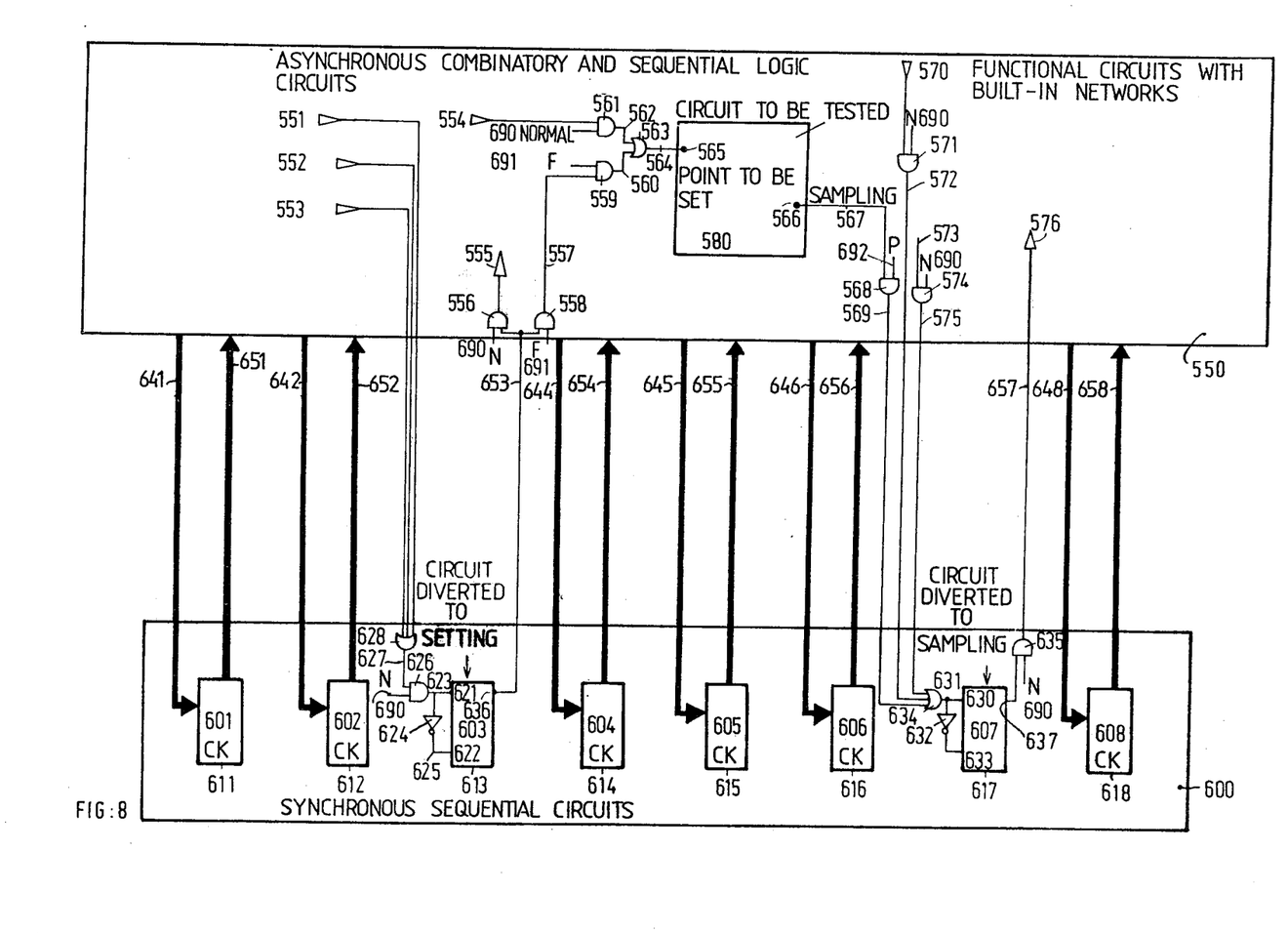
FIG. 8 shows a system according to another particular embodiment of the invention in which certain operational flip-flops are used, on command, to set or to sample.

FIG. 8 shows another embodiment in accordance with the invention.

This arrangement is distinguished from the previous arrangement shown in FIGS. 4, 5, 6 and 7 in that there are no specialized flip-flops for setting and sampling.

In the FIG. 8 arrangement, advantage is taken of the fact that during testing operations it is possible to use flip-flops which are not involved with the precise circuits tested for the purpose of performing setting and sampling operations. Rather than a single testing mode, there are a setting mode in which a logic level for test purposes is applied to the set input point of a circuit to be tested, and a sampling mode in which an output of the circuit to be tested is sampled. These two modes are respectively enabled by a setting (F) mode control signal 691 and a sampling (P) mode control signal 692. There also is a normal (N) mode control signal 690.

In FIG. 8 are shown one flip-flop which is used for setting and one flip-flop which is used for sampling, but this is not intended to be a limitation to the scope of the invention. This arrangement is shown solely for considerations of simplicity in the drawing and explanation, and it is clear that the arrangement could easily involve pluralities of flip-flops without exceeding the scope of the invention.

Flip-flops 601, 602, 603, 604, 605, 606, 607 and 608 operate in accordance with the functions which are allotted to them in the data processing system. Flip-flop 601, which is controlled by clock (CK) signal 611, exchanges signals with the combinatory and similar circuits 550 via connections 641 and 651. Similarly, flip-flop 602, which is controlled by clock (CK) signal 612, dialogues with the combinatory logic circuits 550 via connections 642 and 652. The flip-flops 604, 605, 606 and 608 are similarly connected to the combinatory logic circuits 550.

In the electrical circuits of flip-flops 603 and 607, the electrical circuitry comprising selective gating circuits for connecting them into a shift register has not been shown in order to avoid undue complexity in the drawings.

Consideration will first be given to what happens in the case of flip-flop 603. The circuitry shown connected to the flip-flop 603 comprises a portion of selective gating circuitry, and specifically a portion representative of the active elements when the flip-flop 603 circuit may selectively be directed to the function of setting a logic level. Looking at the electrical circuitry, it can be seen that:

(1) Access to the flip-flop 603 set (S) input 621 is gated by an AND gate 626, which in the normal state in enabled by a normal (N) mode validating signal 690 and during the setting period is not enabled because the validating signal 690 is cut off (logic low); and (2) The flip-flop 603 output line 653 branches to two AND gates 556 and 558. In normal periods, AND gate 556 is enabled by the normal (N) mode validating signal 690 and, during setting periods, AND gate 558 is enabled by a setting (F) mode control signal 691.

Thus, during normal periods the signals 551, 552 and 553 coming from the combinatory circuits 550 arrive at OR gate 628 and, via connection 627, enter AND gate 626, which is enabled.

The signal which emerges from the AND gate 626 is applied directly to the set (S) input 621 of flip-flop 603; and to the zero reset (R) input 622 of flip-flop 603 via an inverter 624.

The clock (CK) signal 613 causes flip-flop 603 to be set in conformity with the signals at its inputs.

The output 636 of flip-flop 603 transmits its state along line 653 to AND gate 556, which has been enabled by the normal (N) mode validating signal 690 (AND gate 558 is not enabled). The output of the AND gate 556 is applied, via line 555, to the combinatory and associated circuits 550 in accordance with the arrangement of the signal processing system.

For the purposes of simplifying the description, it can be said that the operation of each of the other flip-flops 601, 602, 604, 605, 606 and 608 is identical to that of flip-flop 603.

During setting periods, AND gates 558 and 559 are enabled by the setting (F) mode control signal 691. AND gates 561, 556 and 626 on the other hand are not enabled because the normal (N) mode control signal 690 is low.

Under these conditions, flip-flop 603 has its inputs closed to the signals 551, 552 and 553 coming from the combinatory and similar circuits 550. The state of this flip-flop 603 depends only on the initializing operation in the series mode (or shift register mode). Output 636 of flip-flop 603 on the other hand reaches AND gate 558 along line 653 and passes through the AND gate 558 since the AND gate 558 is enabled by the setting (F) signal 691. The output from the AND gate 558 reaches AND gate 559 along line 557. The AND gate 559 is in turn enabled by the setting (F) mode control signal 691, and the signal from the flip-flop 603 output thus reaches OR gate 563 without obstruction. Then, having passed through OR gate 563, the signal reaches the point 565 to be set.

The logic level at this point 565 is thus dictated by the output of flip-flop 603.

This is advantageous since it enables the user to known the value at this point 565 without ambiguity. The value does not depend on events and circuits upstream.

Consideration will now be given to what happens in the case of flip-flop 607. The circuitry shown connected to the flip-flop 607 comprises a portion of selective gating circuitry, and specifically a portion representative of the active elements when the flip-flop 607 circuit may selectively be diverted to the function of sampling.

In normal operation the normal (N) mode validating signal 690 is high and enables AND gates 635, 574 and 571. The sampling (P) mode control signal 692 is low and gate 568 is accordingly not enabled.

It can thus be said that, in normal operation, the signals 570 and 573 coming from the combinatory and similar circuit 550 normally reach inputs 630 and 633 of flip-flop 607.

In particular, signal 570 passes through enabled AND gate 571 and then, via line 572, reaches OR gate 634, through which it passes directly to the set (S) input 630 of flip-flop 607; and indirectly to the zero reset (R) input 633 of flip-flop 607 via an inverter 632.

The signal is transferred to the flip-flop 607 under the control of clock (CK) signal 617.

The output 637 from flip-flop 607 passes through enabled AND gate 635, which is enabled by the normal (N) mode validating signal 690, and reaches the group of combinatory and similar logic circuits 650 via line 657.

It can be said that, when operating in this condition, the flip-flop 607 operates in the same way as the other flip-flops 601, 602, 604, 605, 606 and 608.

When operating in the sampling mode, the values of the validating signals 690 and 692 are reversed: signal 690, which is the normal (N) mode validating signal, is low; and signal 692, which is the sampling (P) mode validating signal, is high. Because of this AND gates 571, 573 and 635 are not enabled, while AND gate 568 is enabled. The signals 570 and 573 coming from the combinatory and similar circuits 550 can no longer gain access to flip-flop 607 since AND gates 571 and 574 are not enabled. Similarly, output 637 of flip-flop 607 can no longer reach the combinatory and similar circuits 550 since AND gate 635 is not enabled.

On the other hand, the point 566 whose state it is desired to sample transmits its state to AND gate 568, which has been enabled by the sampling (P) mode control signal 692. This state is transmitted by line 569 and reaches OR gate 634. After passing through OR gate 634, the signal is applied to the inputs of flip-flop 607, directly in the case of the set (S) input 650, and to the zero reset (R) input 633 via an inverter 632.

The state is transferred to the flip-flop 607 in response to clock (CK) signal 617 which determines the moment of sampling.

The state recorded by flip-flop 607 is extracted during read-out by shift register operation.

In the above description, flip-flop 603 was assumed to be a setting flip-flop and flip-flop 607 was assumed to be a sampling flip-flop.

In fact, both kinds of connection may be applied to one and the same flip-flop, although, of course, the flip-flop will only be able to operate in one of the three modes, normal (N), setting (F) and sampling (P), at a time. The mode is selected by the user.

In extreme cases all the flip-flops belonging to a signal processing system may be capable of operating in all three modes.

The arrangement may, of course, easily be expanded to have a plurality of flip-flops in place of the individual flip-flops shown in the drawing and one skilled in the art will easily be able to expand the arrangement to have far more complex configurations without thereby exceeding the scope of the present invention.

In the two examples shown in FIGS. 4 and 5, it should be remembered that the control or validating signals, namely N for the normal mode, F for the setting mode and P for the sampling mode may, for example, be produced by flip-flops in accordance with the invention.

The invention is not, of course, in any way limited to the embodiment described and illustrated and covers all technical equivalents of the means described, as well as combinations of these if they are made in accordance with the concept of the invention and are employed in the context of the following claims.

What is claimed is:

1. In combination with a logic system of the type having a combinational network and at least one synchronous logic circuit connected to particular points in said combinational network, the combinational network also having intermediate points not directly connected to the synchronous logic circuit and not directly accessible from the exterior of said logic system, a testing system comprising:
   at least one flip-flop;
   an externally accessible input line;
   selective gating circuitry connected to said one flip-flop and arranged, when enabled in a series mode, to effectively connect a flip-flop input to said externally accessible input line such that when a signal is applied to said accessible input line and said flip-flop is clocked a particular logic state is loaded into said flip-flop; and
   said selective gating circuitry being further arranged, when enabled in a setting test mode, to effectively connect a flip-flop output to one of said intermediate points in said logic system;
   said testing system thereby permitting a particular logic state to be serially fed in and applied to said one of said intermediate points.

2. A testing system according to claim 1, comprising:
   a plurality of flip-flops including said one flip-flop;
   said selective gating circuitry being connected to said plurality of flip-flops and arranged, when enabled in the series mode, to form a shift register configuration with one of said flip-flops being the first shift register stage and having an input connected to said externally accessible input line such that when logic signals are applied to said accessible input line and said flip-flops are successively clocked particular logic states are loaded into said flip-flops; and
   said selective gating circuitry being arranged when enabled in the setting test mode, to effectively connect an output of a particular one of said flip-flops to said one of said intermediate points.

3. A testing system according to claim 2, further comprising an externally accessible output line and wherein said selective gating circuitry is further arranged such that, when enabled in the series mode, another one of said flip-flops is the last shift register stage and has an output connected to said externally accessible output line, thereby permitting particular logic states previously loaded into said flip-flops to be successively clocked out and read on said accessible output line; and
   said selective gating circuitry being further arranged, when enabled in a sampling test mode, to effectively connect one of said intermediate points in said logic system to an input of a particular one of said flip-flops;
   thereby permitting the logic state present at said one of said intermediate points to be clocked into said particular one of said flip-flops and then serially clocked out to said accessible output line.

4. A testing system according to claim 3, wherein at least one of said flip-flops is interconnected with said selective gating circuitry in a manner such that said selective gating circuitry, when enabled in the setting test mode, effectively connects an output of said one flip-flop to one of said intermediate points, and such that said selective gating circuitry, when enabled in the sampling test mode, effectively connects an input of the same one of said flip-flops to one of said intermediate points, whereby said one of said flip-flop selectively functions either to set a logic level at one of said intermediate points in the logic system or to sample a logic level at one of said intermediate points in the logic system, depending upon which particular mode is enabled.

5. A testing system according to claim 4, wherein said same one of said flip-flops is interconnected with said selective gating circuitry in a manner such that said selective gating circuitry, when enabled in a normal mode, effectively connects the input and output of said one of said flip-flops to the logic system, whereby said one of said flip-flops also selectively serves a functional purpose during normal operation of the logic system.

6. A testing system according to claim 1, which is fabricated on an integrated circuit chip on which is also fabricated said logic system.

7. A testing system according to claim 1, which is included within a module which also includes said logic system.

8. In combination with a logic system of the type having a combinational network and at least one synchronous logic circuit connected to particular points in said combinational network, the combinational network also having a intermediate points not directly connected to the synchronous logic circuit and not directly accessible from the exterior of a logic system, said testing system comprising:

at least one flip-flop;

an externally accessible output line;

selective gating circuitry connected to said one flip-flop and arranged, when enabled in a series mode, to effectively connect a flip-flop output to said externally accessible output line, thereby permitting a particular logic state previously loaded into said flip-flop to be read on said accessible output line; and said selective gating circuitry being further arranged, when enabled in a sampling test mode, to effectively connect one of said intermediate points in said logic system to an input of said flip-flop;

thereby permitting the logic state present at said one of said intermediate points to be clocked into said flip-flop and then serially read out.

9. A testing system according to claim 8, comprising: a plurality of flip-flops including said one flip-flop;

said selective gating circuitry being connected to said plurality of flip-flops and arranged, when enabled in the series mode; to effectively connect said flip-flops in series to form a shift register configuration with one of said flip-flops being the last shift register stage and having an output connected to said externally accessible output line, thereby permitting particular logic states previously clocked into said flip-flops to be successively clocked out and to be read on said accessible output line; and said selective gating circuitry being arranged when enabled in the sampling test mode, to effectively connect said one of said intermediate points to an input of a particular one of said flip-flops.

10. A testing system according to claim 8, which is included within a module which also includes said logic system.

11. A testing system according to claim 8, which is included within a module which also includes said logic system.

12. A logic system including various logic circuits interconnected by a combinational network configuration, said combinational network having intermediate points not directly connected to any of said logic circuits and not directly accessible from the exterior of said logic system, and said logic system comprising at least one action-taking circuit, said action-taking circuit including at least one device for setting the logic level at at least one of said intermediate points of said combinational network.

13. A logic system according to claim 12, wherein said action-taking circuit comprises at least one device for sampling the logic level at a selected one of said intermediate points of said combinational network.

14. A logic system according to claim 13, wherein said device for sampling the logic level at a selected one of said intermediate points of said combinational network comprises a flip-flop.

15. A logic system according to claim 14, which comprises a plurality of other flip-flops and which comprises selective gating circuitry to selectively connect said flip-flop to a least some of the other flip-flops in the system to allow operation as a shift register.

16. A logic system including various logic circuits interconnected by a combinational network configuration, said combinational network having intermediate points not directly connected to any of said logic circuits and not directly accessible from the exterior of said logic system, and said logic system comprising at least one action-taking circuit, said action-taking circuit including at least one device for selectively setting the logic level at at least one of said intermediate points of said combinational network and for selectively sampling the logic level at a selected one of said intermediate points of said combinational network.

17. A logic system according to claim 16, wherein said device which serves to set and to sample comprises a flip-flop.

18. A logic system according to claim 17, which comprises a plurality of flip-flops and which comprises selective gating circuitry to selectively connect said flip-flop to at least some of the other flip-flops in the system to allow operation as a shift register.

19. A logic system according to claim 12, wherein said device for setting the logic level at at least one of said intermediate points of said combinational network comprises a flip-flop.

20. A logic system according to claim 19, which comprises a plurality of other flip-flops and which comprises selectively gating circuitry to selectively connect said flip-flop to at least some of the other flp-flops in the system to allow operation as a shift register.

21. A logic system according to claim 12, wherein said logic circuits, combinational network, and action-taking circuit are all fabricated on a single integrated circuit chip.

22. A logic system according to claim 12, wherein said logic circuits, combinational network and action-taking circuit are all included within a single module.

* * * * *